(12) United States Patent
Nair

(10) Patent No.: US 7,342,980 B2
(45) Date of Patent: Mar. 11, 2008

(54) ESTIMATING CARRIER PHASE IN COMMUNICATION SYSTEMS

(75) Inventor: Sathian Nair, Kerala (IN)

(73) Assignee: Intel Corporation, Santa Clara, CA (US)

( * ) Notice: Subject to any disclaimer, the term of this patent is extended or adjusted under 35 U.S.C. 154(b) by 815 days.

(21) Appl. No.: 10/748,967

(22) Filed: Dec. 30, 2003

(65) Prior Publication Data

US 2005/0143036 A1   Jun. 30, 2005

(51) Int. Cl.
*H04L 27/14* (2006.01)
*H04L 27/16* (2006.01)
*H04L 27/22* (2006.01)

(52) U.S. Cl. .................. 375/326; 375/327; 375/375; 375/373; 375/376

(58) Field of Classification Search ............... 375/373, 375/375, 376, 326, 327, 219, 222
See application file for complete search history.

(56) References Cited

U.S. PATENT DOCUMENTS

| | | | |
|---|---|---|---|
| 5,577,027 A | 11/1996 | Cheng | |
| 5,901,180 A * | 5/1999 | Aslanis et al. | 375/261 |
| 6,560,276 B1 | 5/2003 | Long et al. | |
| 6,711,205 B1 | 3/2004 | Beaney | |
| 6,807,234 B2 | 10/2004 | Hansen | |
| 7,058,134 B2 | 6/2006 | Sampath | |
| 2004/0114675 A1 * | 6/2004 | Crawford | 375/149 |
| 2004/0240534 A1 | 12/2004 | Nair | |

OTHER PUBLICATIONS

International Telecommunication Union, "Interfaces and voiceband modems", *Series V: Data Communication Over The Telephone Network, ITU-T V.34*, (Feb. 1998), 79 pages.

International Telecommunication Union, "Simultaneous Transmission of Data and Other Signals", *Series V: Data Communication Over the Telephone Network, ITU-t V.90*, (Sep. 1998), 48 pages.

* cited by examiner

*Primary Examiner*—Phuong Phu
(74) *Attorney, Agent, or Firm*—Blakely, Sokoloff, Taylor & Zafman LLP

(57) ABSTRACT

Disclosed herein are methods, articles, and apparatus for estimating a carrier phase in a communication system. A method, according to one aspect, may include receiving carrier phase estimation information, and estimating a carrier phase based on the carrier phase estimation information by comparing a property of the carrier phase estimation information with a value that is expected assuming phase lock.

28 Claims, 6 Drawing Sheets

ESTIMATING CARRIER PHASE IN COMMUNICATION SYSTEMS

BACKGROUND

In coherent communications systems, the carrier phase of the transmitter and the local phase generated by the receiver may differ due to oscillator drift, differences in temperature, and other factors. In such systems, the phase of the receiver is generally synchronized or locked relative to the phase of the transmitter in order to allow the receiver to perform demodulation effectively.

Traditionally, Costas loops, and other Phase Locked Loops (PLL), have been employed to achieve the phase synchronization or lock. However, such loops are generally complex and difficult to implement in a digital communication system. Another potential problem with employing such loops is that the time to achieve phase lock may become excessive. The initial phase error is often large, since the transmitter and the receiver are initially un-synchronized. In some cases, depending upon the particular PLL, synchronization may not be achieved, due to phenomena such as lingering, or terminal loop hang-up.

Aided acquisition of phase lock with PLL has been employed to reduce the time to achieve phase lock. In a representative example of aided acquisition, a voltage ramp, or other external driving signal, may be input to an oscillator of the PLL in order to drive the PLL through a phase space that is suspected to contain the lock-in-region. Such aided acquisition generally achieves phase lock more rapidly than unaided acquisition. However, often there is a lack of a good estimate of the lock-in-region.

BRIEF DESCRIPTION OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
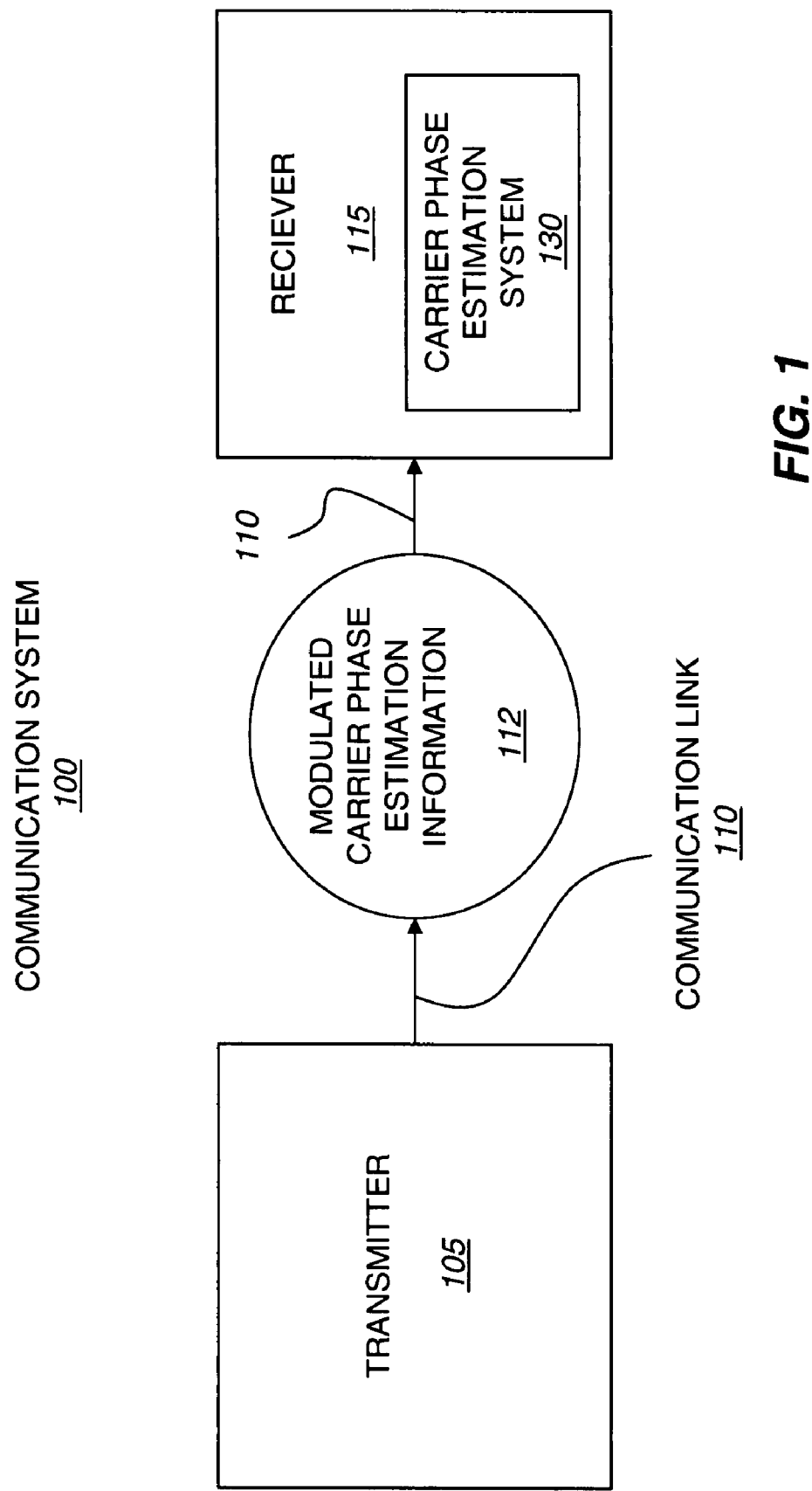
FIG. 1 is a block diagram of an exemplary communication system in which an embodiment of the invention may be implemented.

FIG. 1 is a block diagram of an exemplary coherent communication system 100 in which an embodiment of the invention may be implemented. The communication system includes a transmitter 105 communicatively coupled with a receiver 115 by a communication link 110.

The transmitter may transmit communication signals over the communication link. The communication signals may include modulated waveforms generated with the use of a communications constellation. In one embodiment of the invention, the communication signals may include modulated carrier phase estimation information 112. The carrier phase estimation information may include information that the receiver may use to estimate a carrier phase associated with the transmitter. Further details of the carrier phase estimation information will be set forth below.

The communication link, which may include a wired link, such as a telephone line, or a wireless link, may convey the communications signals to the receiver. The receiver may receive the communications signals, including the modulated carrier phase estimation information.

The receiver includes a carrier phase estimation system to estimate the carrier phase associated with the transmitter based on the carrier phase estimation information. Once the carrier phase has been estimated, and after any optional refinement of the estimate with a PLL, or other conventional phase locking device, the receiver may demodulate further communication signals received from the transmitter, generally with improved fidelity.

Figure 2:
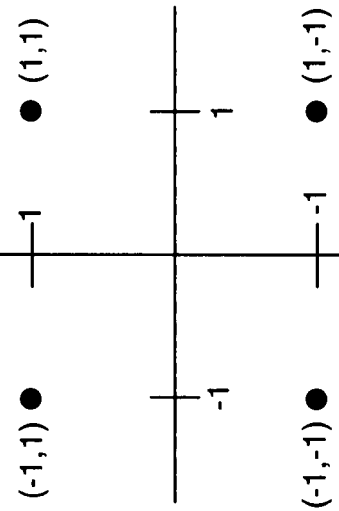
FIG. 2 shows an exemplary four-point communications constellation that may be used to generate the communications signals, according to one embodiment of the invention.

Now, as discussed above, the communication signals may be based on a communications constellation. FIG. 2 shows an exemplary four-point communications constellation that may be used to generate the communications signals, according to one embodiment of the invention. In general, constellations include patterns representing the possible states of a carrier wave, each of which is associated with a particular bit combination. The constellation shows the number of states that can be recognized as unique changes in a communications signal and thus the number of bits that can be encoded in a single change of state. The transmitter may transmit points from the communications constellation. The receiver may receive and interpret the phase and amplitude of the points in order to make symbol decisions.

The illustrated constellation includes four points arranged in a reticulated or grid like arrangement relative to four quadrants defined by an x-axis and a y-axis. The four points include a first point (1,1), a second point (−1,1), a third point (−1,−1), and a fourth point (1,−1). Each point of the constellation has phase. In particular, the first point (1,1) has a phase of 45°, the second point (1,1) has a phase of 135°, the third point (−1,−1) has a phase of 225°, and the fourth point (1,−1) has a phase of 315°. Each of the four points also has amplitude of one. The illustrated constellation is relatively simple so as to avoid obscuring the description. It will be apparent that more complicated constellations, with potentially many more points, may also optionally be employed.

Certain start-up signals or sequences of points are defined for modems or other apparatus that are compliant with ITU-T Recommendation V.34, published in February 1998, by the Telecommunication Standardization Sector of the International Telecommunication Union. For example, the sequence of points (1,1) then (−1,1) is a start-up signal that is supported by modulators/demodulators (modems) that comply with ITU-T Recommendation V.34. This start-up signal is often referred to as signal "S". The signal S is a start-up signal for compliant modems that is generally transmitted during Phase 3 of call establishment.

Figure 3:
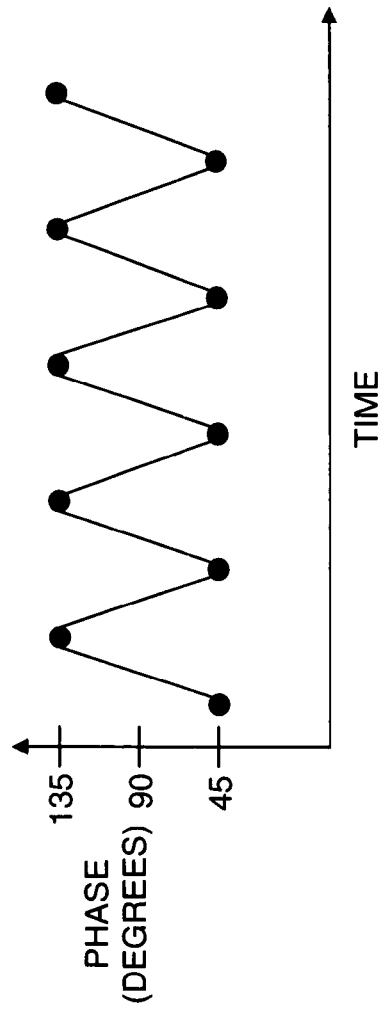
FIG. 3 shows a plot of the phases of a five-sequence portion of the signal "S".

FIG. 3 shows a plot of the phases of a five-sequence portion of the signal S. The phases are plotted in degrees on the y-axis against transmission time on the x-axis. The signal S generally includes 54 repeat sequences similar to the five-sequence portion shown.

The sequence (1,1) then (−1,1) inherently has various predetermined properties. Several of the properties are based on phase or amplitude. One property is that the phases of the sequence alternate from 45° for the first point (1,1) to 135° for the second point (−1,1). Another property is that the phase of the second point, (−1,1), is rotated counterclockwise by 90° relative to the phase of the first point, (1,1). That is, a difference in the phases of the second and the first points is 90° (i.e., 135°−45°). Yet another property is that the average phase of two consecutive symbols of the dual phase sequence is 90° (i.e., (45°+135°)/2). Still further properties of the sequence are based on amplitude. For example, one property is that the squared magnitude of the amplitude of the sequence is two. Still other properties, mathematical properties, and statistical properties of the sequence will be apparent to those skilled in the arts, and having the benefit of the present disclosure.

The inventor has discovered that one or more points from a communications constellation may be employed as carrier phase estimation information to allow a receiver to estimate a carrier phase associated with a transmitter. In various embodiments of the invention, the carrier phase estimation information may include a carrier phase estimation point, plurality of points, or sequence of points from a communications constellation. In one aspect, a known start-up signal including one or more points from a communications constellation may be employed as carrier phase estimation information. For example, in one particular embodiment of the invention, the signal S may be employed as carrier phase estimation information. Alternatively, in various other embodiments of the invention, other start-up signals or sequences defined for ITU-T V.32, V.34, or V.90 compliant modems may be employed as carrier phase estimation information. Exemplary signals that are potentially suitable include, but are not limited to, the signals "S-bar", "Sh", and "Sh-bar". These signals are often employed for timing synchronization or other purposes. Taking advantage of a signal that is already supported by modems and other apparatus may potentially offer a simplified implementation, among other advantages.

As yet another option, any one or more points or sequence of points from a communications constellation may potentially be employed as carrier phase estimation information, whether or not the one or more points or sequence of points is a known start-up signal. For example, in one aspect, the point (−1,−1), or repeat transmissions of the point (−1,−1), may be employed as carrier phase estimation information. In another aspect, the arbitrary sequence (1,1), (−1,1), (−1,−1), then (1,−1), may be employed as carrier phase estimation information. It will be apparent that a large number of alternate points or sequences may also optionally be employed for the simple 4-point constellation, or from other more sophisticated constellations, or super-constellations, which are known in the arts.

Figure 4:
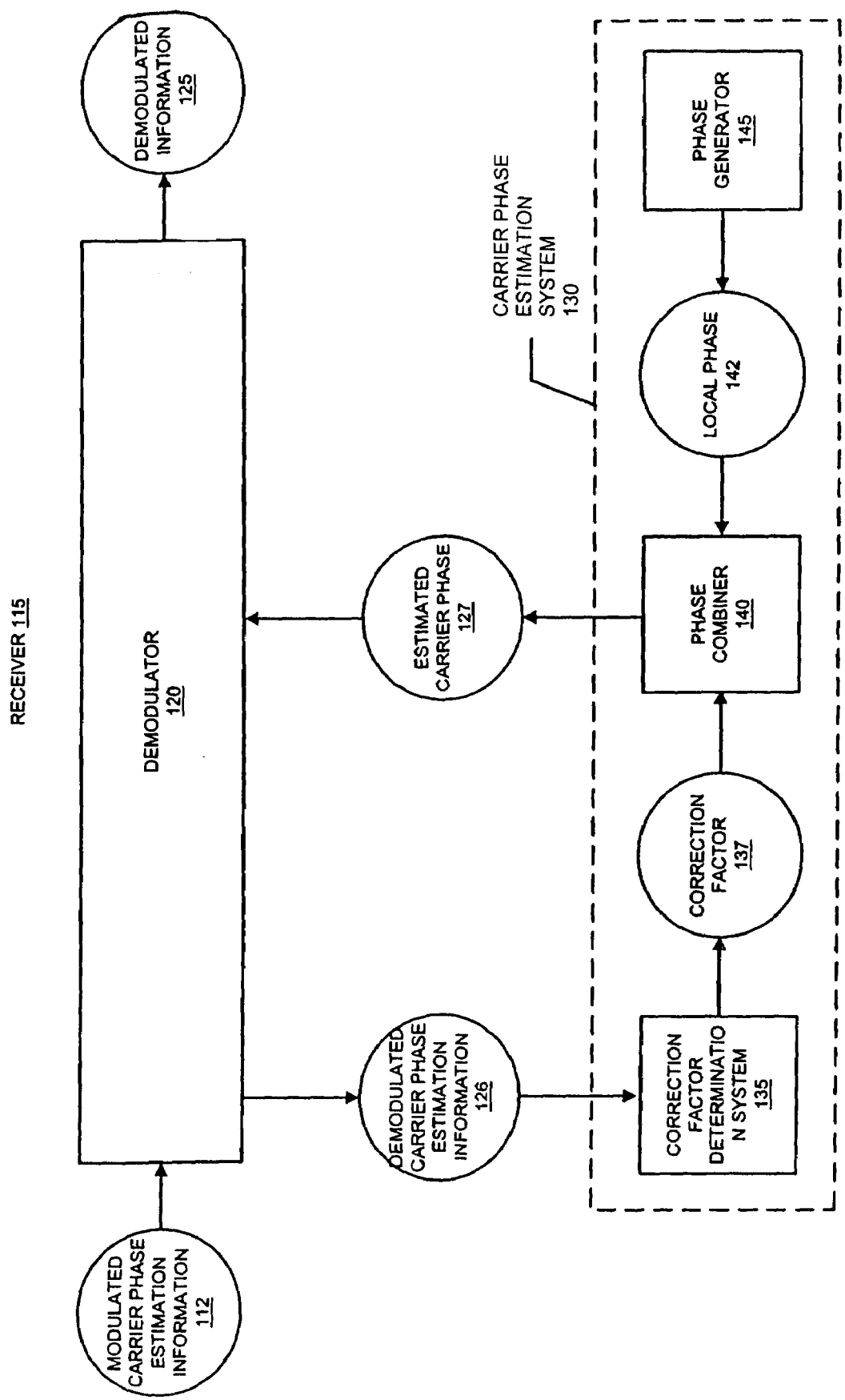
FIG. 4 shows a receiver including a carrier phase estimation system, according to one embodiment of the invention.

FIG. 4 shows a receiver 115, according to one embodiment of the invention. In one exemplary embodiment of the invention, the receiver may include a modem or a computer system or other apparatus including the modem. The modem may include a server modem, a data modem, a fax modem, a (Digital Subscriber Line) DSL modem, an analog 2-wire modem, or other modems known in the arts. In one particular embodiment of the invention, in which the signal S is employed, the modem may include a ITU-T Recommendation V.34 compliant modem. In another exemplary embodiment of the invention, the receiver may include a portable radio communication device. The receiver includes a demodulator 120, and a carrier phase estimation system 130 bi-directionally coupled with the demodulator.

The demodulator 120 may receive modulated carrier phase estimation information 112. The demodulator may include conventional demodulation logic in order to demodulate the modulated carrier phase estimation information. At least initially, the demodulator may perform demodulation using a local phase associated with the receiver. For example, in the illustrated embodiment, the demodulator may receive a phase generated by a local phase generator 145, for example an oscillator, or a sine or cosine table. The demodulator may provide demodulated carrier phase estimation information 126 to the carrier phase estimation system 130.

Now, unless the local phase of the receiver is synchronized or locked relative to the phase of the transmitter, which initially is often not the case, the demodulated carrier phase estimation information 126 demodulated by the receiver, and its properties, may differ from the expected, transmitted carrier phase estimation information, and its properties. Also, the received and demodulated carrier phase estimation information, and its properties may differ from information and properties that are expected, assuming phase lock. The difference may be related to the magnitude of the phase error. In one aspect, the receiver may use the difference to estimate a carrier phase having a reduced phase error.

Figure 5:
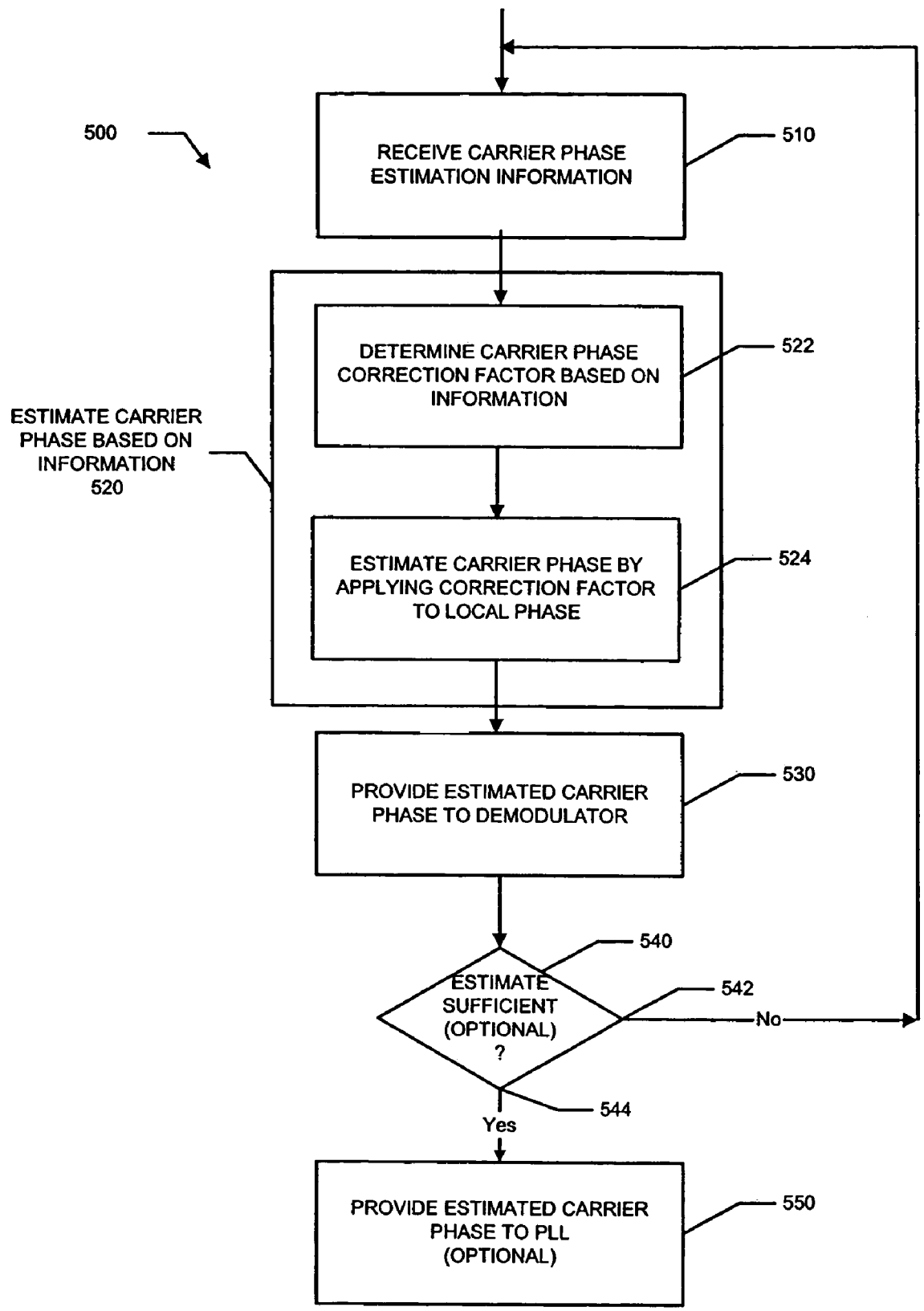
FIG. 5 shows a carrier phase estimation method, according to one embodiment of the invention.

After demodulation of the carrier phase determination information, the carrier phase may be estimated. FIG. 5 shows a carrier phase estimation method 500 that may be performed by the carrier phase estimation system 130, according to one embodiment of the invention.

The method includes receiving demodulated carrier phase estimation information 126, at block 510. Referring again to FIG. 4, the illustrated carrier phase estimation system 130 includes a correction factor determination system 135. The correction factor determination system is coupled with the demodulator and may receive the demodulated carrier phase estimation information 126.

To further illustrate the concepts, according to one aspect of the invention, consider the use of the sequence (1,1) then (−1,1). The transmitter may transmit the signal S during the initial stages of call establishment and the receiver may receive modulated carrier phase estimation information representing at least the sequence (1,1) then (−1,1), which may be demodulated. In one embodiment of the invention, the demodulated carrier phase estimation information 126 may include a first phase ($\phi_1$) corresponding to the first point (1,1), and a second phase ($\phi_2$) corresponding to the second point (−1,1). The first and the second phases may be related to, but be different from, the expected values of 45° and 135°, due to performing demodulation with a phase error or offset between the phases of the transmitter and the receiver. As a prophetic example, the first phase and the second phase may include 70° and 160°, respectively. The difference may be attributable to the phase error or offset and may be used by the receiver to estimate a better carrier phase, with reduced phase error or offset. The phases may only be identical if the phase of the receiver is synchronized or locked relative to the phase of the transmitter.

Referring again to the method of FIG. 5, the carrier phase estimation system 130 may then estimate the carrier phase based on the received carrier phase estimation information, at block 520. It may be appropriate to estimate the carrier phase during call establishment, in one aspect based on a signal transmitted during call establishment, so that data may be transmitted after call establishment based on the benefit of the estimate.

In one embodiment of the invention, estimating the carrier phase may include first determining a carrier phase correction factor 137 based on the information, at block 522. The carrier phase correction factor may quantify the error or offset between the transmitter carrier phase and the local phase. The correction factor determination system 135 may include logic, such as hardware, software, or some combination, to determine a carrier phase correction factor based on the received demodulated carrier phase estimation information. In one aspect, the correction factor determination system may include Digital Signal Processor (DSP) logic that may be programmed by software.

In one embodiment of the invention, the carrier phase estimation system may know and expect particular carrier phase estimation information, or one or more properties associated with the particular carrier phase estimation information. The expected properties may assume zero phase error, or phase lock. The correction factor determination system may determine the correction factor by comparing the received demodulated carrier phase estimation information 126, or a property thereof, with corresponding information or a corresponding value that is known ahead of time, and expected assuming phase lock. For example, the expected information or value may be subtracted from the received information or property, or visa versa. The properties and values may include a phase, amplitude, difference in phases, difference in amplitudes, average phase, average amplitude, or a weighted average phase, for example. Numerous other properties are also potentially suitable. The difference may be attributed to phase error, and may be used to determine an improved estimate of the carrier phase, which would give a reduced phase error.

For example, in one particular embodiment of the invention, the carrier phase estimation system may know and expect the sequence (1,1) then (−1,1), or the signal S, and may know and expect that the average phase of the sequence, or the signal, is 90°=(45°+135°)/2. A carrier phase correction factor may be determined by subtracting the expected average of the phases of the sequence, in this case 90°, from the average of the received phases $\phi_1$ and $\phi_2$ of the demodulated carrier phase estimation information 126, which may be different from 90° due to phase error, according to the equation:

Carrier Phase Correction Factor=$(\phi_1+\phi_2)/2-90°$

By way of example, if the phases $\phi_1$ and $\phi_2$ are 70° and 160°, respectively, then the average pf the phases $\phi_1$ and $\phi_2$ may be 115°=(70°+160°)/2, and the correction factor may be 25°. Use of the average is not required, and differences or other properties of the sequence may also optionally be employed.

Accordingly, the carrier phase correction factor, and the estimate of the carrier phase, may be determined based in part on evaluating a mathematical relationship between a property of the demodulated carrier phase information 126 and an expected value of the property assuming phase lock.

Referring again to the method of FIG. 5, estimating the carrier phase at block 520 may then include applying the correction factor to a local phase, at block 524. The correction factor determination system 130 includes a phase combiner 140 coupled with the correction factor determination system 135 and a phase generator 145 coupled with the phase combiner. The correction factor determination system may provide the determined carrier phase correction factor 137 to the phase combiner. The phase generator may provide a local phase 142 to the phase combiner. In one aspect, the phase generator may include a conventional oscillator. Alternatively, in another aspect, such as in a DSP embodiment implemented in software, the phase generator may include a table, such as a sine or cosine table, that may be used to generate the phase.

The phase combiner may include software, hardware, or combined software and hardware logic to estimate a carrier phase by adding, combining, or otherwise applying the carrier phase correction factor 137 to the local phase 142. For example, an estimated carrier phase may be equated to the sum of the carrier phase correction factor and the local phase, according to the equation:

Estimated Carrier Phase=Carrier Phase Correction Factor+Local Phase

By way of example, if the local phase 142 is 72° and the correction factor is 25° then the estimated carrier phase may be 97°. In an embodiment of the invention in which the local phase generator is implemented as a sine table, for example, the table may be consulted for a next entry for each incoming sample, and the current correction factor may be added to the local phase entry.

Referring again to the method of FIG. 5, the estimated carrier phase may then be provided to the demodulator, at block 530. The phase combiner 140 is coupled with the demodulator 120 and may provide the estimated carrier phase 127 to the demodulator. The estimated carrier phase 127 typically has reduced phase error or offset compared to the local phase 142. This reduced phase error or offset may allow the demodulator to perform demodulation more effectively.

If desired, an optional determination may be made, at determination block 540, whether the carrier phase estimate is sufficient. This may be done in a variety of ways. In one embodiment of the invention, the carrier phase determination system may determine whether the demodulated carrier phase estimation information 126, or a property thereof, is sufficiently close to corresponding information or a corresponding value that is known ahead of time, and expected assuming phase lock. The determination of closeness may involve a comparison with a threshold value that is regarded to be a sufficient indication of closeness.

For example, in the case of the sequence (1,1) then (−1,1), the carrier phase determination system may determine whether the average of the received phases $\phi_1$ and $\phi_2$ of the demodulated carrier phase estimation information 126 is greater than a lower threshold, for example 85° or 87°, and less than an upper threshold, for example 93° or 95°. The lower threshold may be less than the expected average phase by a predetermined number of degrees, such as 3° or 5°, and the upper threshold may be greater than the expected average phase by a predetermined number of degrees, such as 3° or 5°. Such a threshold may allow a limited amount of uncertainty due to noisy line conditions, and other factors. As a general guideline for the threshold, the inventors have discovered that the estimation method disclosed herein may be capable of locking the carrier phase to an accuracy of about $(2\pi/360)$ radians, or better. In the case of a low-noise channel, the inventors have observed that thresholds such as those discussed above may be achieved within two iterations of the method. More repeat iterations of the method may be appropriate in noisy channels.

In an alternate embodiment of the invention, rather than determining whether the estimated carrier phase is sufficient, the method may be employed a predetermined number of times, for example one, two, three, four, five, or a higher number of times. An incremental counter may be employed and incremented each time a new carrier phase estimate is made. The determination logic may hold that the estimated carrier phase is insufficient until a value of the incremental counter achieves or surpasses a predetermined threshold value. Then, once the threshold value has been achieved or surpassed, the determination logic may hold that the estimated carrier phase is sufficient.

The method may advance differently, depending upon the outcome of the determination. If "no" is the determination 542, then the method may return to block 510, where a new estimate of the carrier phase may be made. In repeat estimations of the carrier phase, the previous estimates may be refined, and the phase error further reduced. Alternatively, if "yes" is the determination 544, that is, the estimated carrier phase is determined to be sufficient, then the method may advance to block 550.

At block 550, the estimated carrier phase may optionally be provided as an input to a Phase Locked Loop (PLL), or other conventional continuous fine phase locking device. The initial carrier phase offset or error traditionally processed by PLL may be very large, since the transmitter and the receiver are generally not synchronized. The amount of time for a communication device to come into phase lock can be an important system design consideration. Often, the time to achieve lock may vary depending on the initial phase error. In an embodiment of the invention, an estimated carrier phase as disclosed herein may be employed as an initial so-called coarse carrier phase lock to reduce an initial phase error that may then be further refined or perfected by the PLL in a continuous mode throughout data reception. The estimate may aid the operation of the PLL in achieving finer and continuous phase lock more rapidly, and with less likelihood for lingering or terminal loop hang-up.

Figure 6:
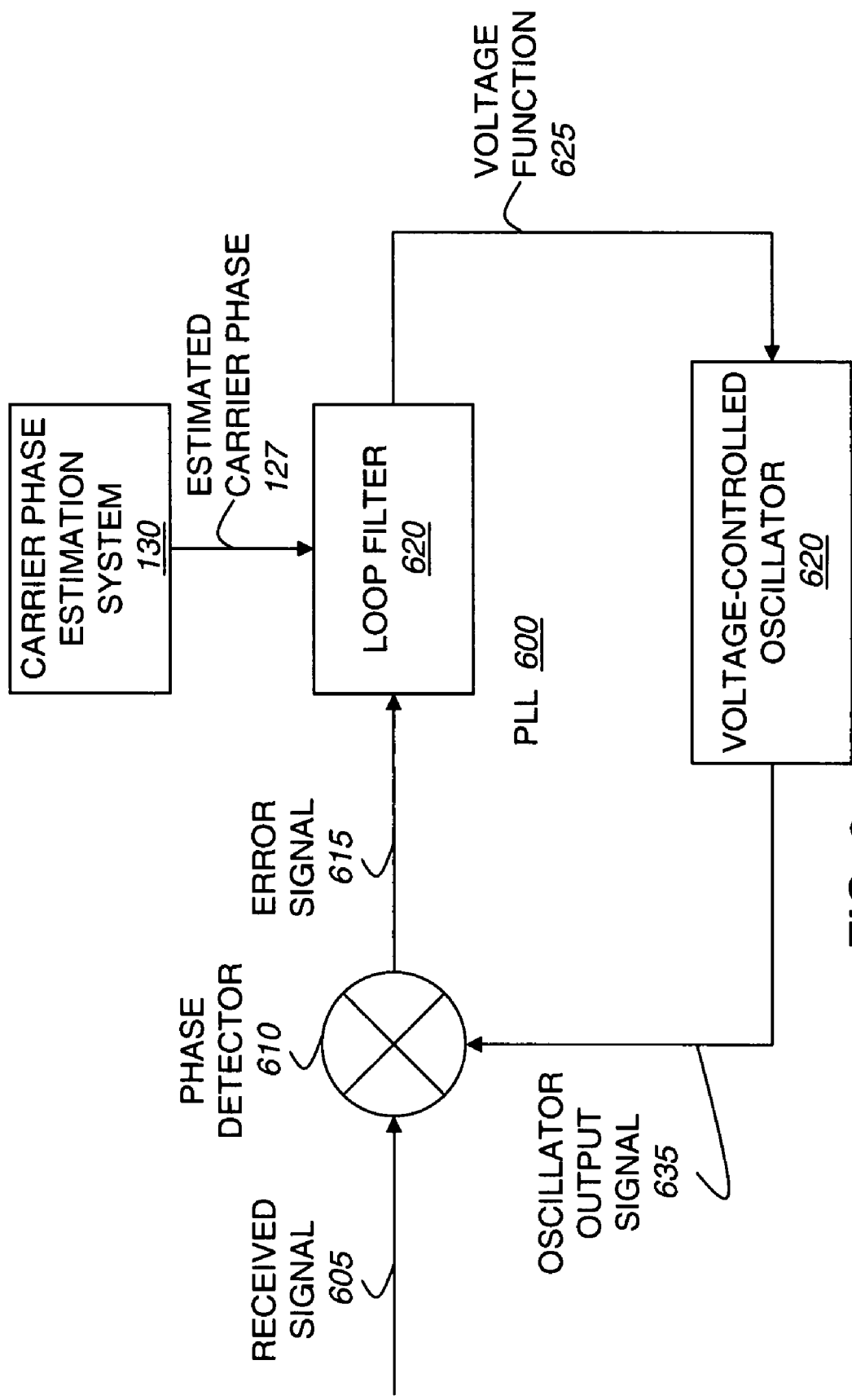
FIG. 6 is a block diagram showing a carrier phase estimation system providing an estimated carrier phase to a PLL, according to one embodiment of the invention.

FIG. 6 is a block diagram showing a carrier phase estimation system 130 providing an estimated carrier phase 127 to a simple PLL 600, according to one embodiment of the invention. A representative goal of the PLL may be to maintain a demodulating wave, such as a sine or cosine wave, which matches the incoming carrier wave. The PLL generally achieves this goal by providing a servo-control loop to control the phase of a replica signal of the incoming carrier signal generated by the PLL.

The PLL includes a phase detector 610, a loop filter 620, and a voltage-controlled oscillator 630. The phase detector generally represents a device that is able to produce a measure of the difference in phase between an incoming received signal 605 and the local oscillator output frequency 635 or replica supplied by the voltage-controlled oscillator. The phase detector provides an error signal 615 representing the difference to the loop filter. Over time, the incoming signal and the replica change relative to one another due to the synchronization, and the time-varying differences in the phases are provided to the loop filter. The loop filter may govern the response of the PLL to the phase difference by providing a voltage function 625 representing time varying voltages to the voltage-controlled oscillator. The voltage-controlled oscillator may produce the replica or reference signal. The voltage-controlled oscillator generally represents a sinusoidal oscillator whose output oscillator signal 635 is controlled as a generally linear function of an input voltage level supplied to the oscillator from the loop filter. The PLL may detect and reduce the phase error by finding the appropriate voltage supplied to the oscillator.

In one embodiment of the invention, the estimated carrier phase 127 may also be provided to the loop filter from the carrier phase estimation system 130. The estimate may lock the carrier phase within an accuracy of about $(2\pi/360)$ radians, or better, which may help the PLL to rapidly and robustly achieve phase lock. In one aspect, the estimate from the carrier phase estimation system may be provided to the PLL continually, and the PLL may further improve the phase lock accuracy.

A relatively simple PLL has been used to illustrate the concepts. Second and higher order PLL, Costas loops, and other relatively more sophisticated loops may also optionally be employed. In general, the estimated carrier phase may be used to aid the acquisition of phase lock by driving the PLL through a phase space suspected to contain the lock-in region.

It is noted that the use of a PLL or other device to further reduce the phase error is not required. If the carrier phase has been estimated to a sufficient accuracy for the intended application, then the receiver may simply use the carrier phase for demodulation, or other purposes, without further phase locking. It is also worth repeating that, in one embodiment of the invention, it is not required to provide the estimated carrier phase to the demodulator, as shown in FIG. 4, and discussed at block 530. Rather, in this alternate embodiment of the invention, the estimated carrier phase may be provided directly to the PLL or other device. In any event, the demodulator may ultimately benefit from the carrier phase estimate, and may perform demodulation based, at least in part, on the estimate. Referring again to FIG. 4, the demodulated information 125 may be provided to other conventional components of the receiver (not shown).

The carrier phase estimation systems disclosed herein may be employed in a variety of different types of receivers that are known in the arts. Further details of two exemplary receivers, namely a computer system, and a portable radio communication device (e.g., a cell phone), are discussed further below. However, it will be appreciated that the estimation systems may also optionally be employed in satellites, base stations, geographic positioning systems, airplanes, and other receivers known in the arts.

Figure 7:
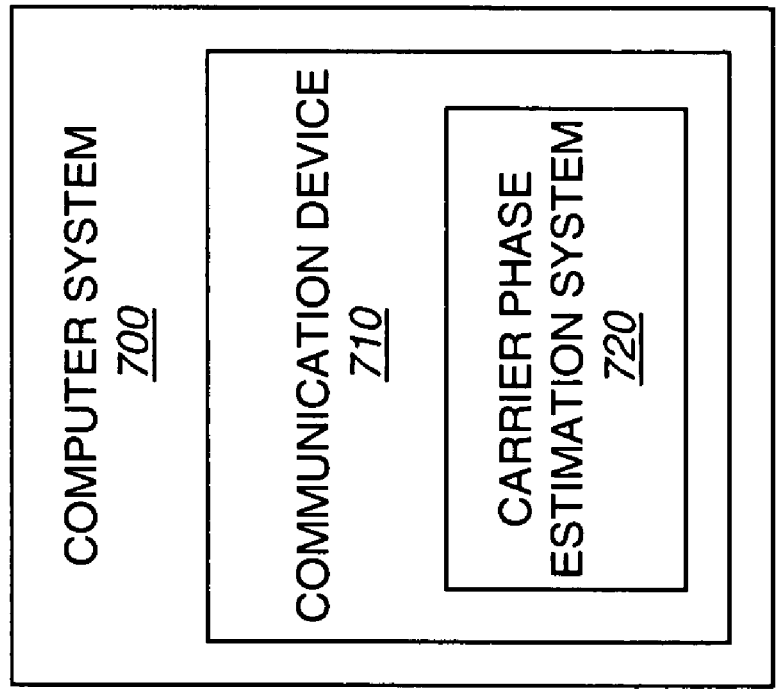
FIG. 7 shows a computer system in which an embodiment of the invention may be implemented.

FIG. 7 is a block diagram of an exemplary computer system 700 in which an embodiment of the invention may be implemented. The computer system generally represents an apparatus including hardware and/or software for processing data. In various embodiments, the computer system may include, but is not limited to, a laptop computer, desktop computer, server, mainframe, and the like.

The computer system may include a bus to communicate information, a processor coupled with the bus to process information, a random access memory (RAM) or other dynamic storage device coupled with the bus to store information and instructions to be executed by the processor. The RAM may also be used to store the operating system, application software, and like instructions for processing data. The RAM is often referred to in the arts simply as main memory. Different types of RAM memory that are each employed in some, but not all computer systems, include static-RAM (SRAM) and dynamic-RAM (DRAM). The computer system may also include a read only memory (ROM) or other static storage device coupled with the bus to store static information and instructions for the processor, such as the BIOS. Different types of memory that are each employed in some, but not all, computer systems include Flash, programmable ROM (PROM), and erasable-and-programmable ROM (EEPROM).

If appropriate, a drive for a magnetic disk, zip, optical disc, or other data storage device may be coupled with the computer system to store information and instructions. The computer system may also be coupled via the bus to a display device, such as a cathode ray tube (CRT) or liquid crystal display (LCD), to display information to an end user. If appropriate, a data input device, such as a keyboard or other alphanumeric input device including alphanumeric and other keys, may be coupled with the bus to communicate information and command selections to the processor. Another type of user input device is a cursor control device, such as a mouse, a trackball, or cursor direction keys, to communicate direction information and command selections to the processor and to control cursor movement on the display.

The illustrated computer system includes a communication device 710. The communication device may allow the computer system to communicate with and receive information from a communication system, such as the Internet, or another network. In various embodiments of the invention, the communication device may include a modem (modulator/demodulator), server modem, network interface card, or other communication device for coupling a computer system with a network. The illustrated communication device 710 is shown inside the computer system, as will often be the case in personal computers, laptops, and the like. For example, the communication device may include a modem card that may be coupled with the bus, for example by a Peripheral Components Interconnect (PCI) bus. However, in an alternate embodiment of the invention, the communication device may reside outside the computer system. For example, in the case of a server, depending upon the amount of traffic, the communication device may include a plurality of server modem cards in a box outside of the chassis of the computer system. One further aspect, if desired, the communication device may be coupled with an antenna to allow for wireless communications.

Now, as has been discussed elsewhere herein, there may be phase errors or offsets between a local phase associated with the computer system, and a phase associated with a remote communications system component, or transmitter. The illustrated communication device includes a carrier phase estimation system 720, according to one embodiment of the invention. The carrier phase estimation system may have characteristics similar to those disclosed elsewhere herein. The carrier phase estimation system may include software, hardware, or some combination of software and hardware.

Figure 8:
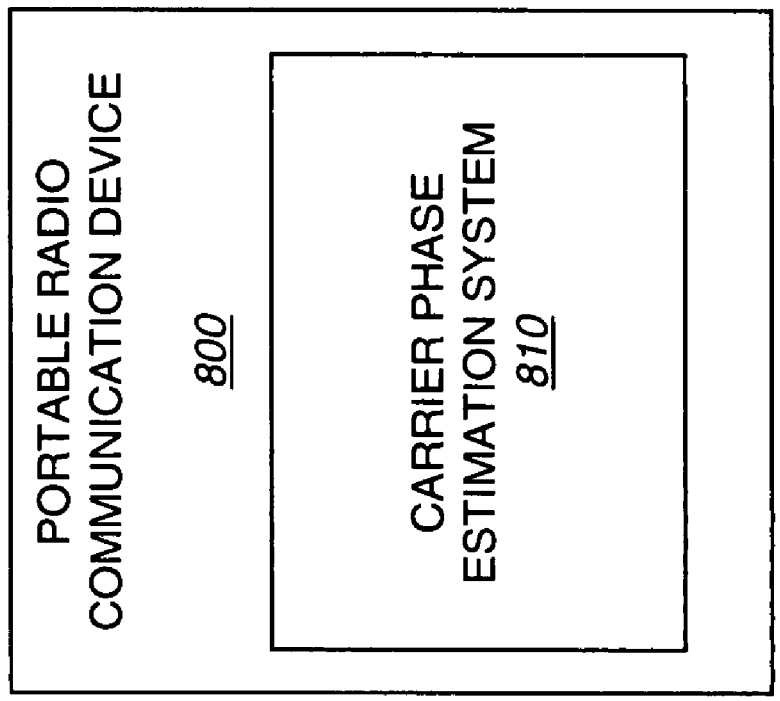
FIG. 8 shows a portable radio communication device in which an embodiment of the invention may be implemented.

FIG. 8 is a block diagram of an exemplary portable radio communication device 800 in which an embodiment of the invention may be implemented. The portable radio communication device generally represents a device including hardware and/or software for sending and receiving communication messages using radio frequency energy. In various embodiments, the portable radio communication device may include, but is not limited to, a cell phone, pager, personal digital assistant (e.g., for email), wireless camera, and the like.

The portable radio communication device may receive digital data from a communications system. The communication device may include a conventional antenna for this purpose. In one embodiment of the invention, the communication device may include a GSM (Global System for Mobile Communications) transceiver. The GSM transceiver may allow for CDMA (Code Division Multiple Access) or TDMA (Time Division Multiple Access) communications, for example. This particular type of transceiver is typically employed in some, but not all, portable radio communication devices. Likewise, this particular type of transceiver is typically employed in some, but not all, cell phones. Another conventional component often included in the portable radio communication device is a memory. In the case of a cell phone, the memory may be used to store phone numbers, and the like. A type of memory that is often employed in some, but not all, portable radio communication devices, including in some, but not all, cell phones, is a Flash memory. A potential advantage of the Flash memory is that information may be retained without power, so that stored information, for example phone numbers, will not be lost.

Now, as previously discussed, there may be phase errors or offsets between a local phase associated with the portable radio communication device, and a phase associated with a remote communications system component, for example a base station. The portable radio communication device includes a carrier phase estimation system 810, according to one embodiment of the invention, to estimate a carrier phase. The carrier phase estimation system may have characteristics as described elsewhere herein, and may be implemented in software, hardware, or some combination.

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known circuits, structures, devices, and techniques have been shown in block diagram form or without detail in order not to obscure the understanding of this description.

An embodiment of the invention may include various operations. The operations of the embodiment may be performed by hardware components, or may be embodied in machine-executable instructions, which may be used to cause a general-purpose or special-purpose processor or logic circuits programmed with the instructions to perform the operations. Alternatively, the operations may be performed by a combination of hardware and software.

An embodiment of the invention may be provided as a program product or article of manufacture, which may include a storage medium or machine-readable medium having stored thereon an instruction or instructions, which may be used to program a machine, such as a microelectronic device, a microprocessor, an Application Specific Integrated Circuit (ASIC), a digital signal processor, a computer system, or other machine, to perform a process. The storage medium may include, but is not limited to, floppy diskettes, optical disks, CD-ROMs, and magneto-optical disks, ROMs, RAMs, EPROMs, EEPROMs, magnet or optical cards, Flash memory, or other type of media/machine-readable medium suitable for storing electronic instructions. Moreover, an embodiment of the invention may also be downloaded as a computer program product, wherein the program may be transferred from one computer to another computer by way of data signals embodied in a carrier wave or other propagation medium via a communication link (e.g., a modem or network connection).

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment", or "an embodiment", or "in one aspect" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. A method comprising:
   receiving carrier phase estimation information;
   estimating a carrier phase based on the carrier phase estimation information by comparing a property of the carrier phase estimation information with a value that is expected assuming phase lock, including:
   determining a carrier phase correction factor based on the comparison of the property of the information with the value that is expected assuming phase lock;
   determine a local phase; and
   determining the carrier phase by applying the carrier phase correction factor to the local phase.

2. The method of claim 1 wherein receiving the carrier phase estimation information comprises receiving one or more points from a communications constellation.

3. The method of claim 2, wherein estimating the carrier phase comprises comparing a phase associated with the one or more points with a phase value that is expected assuming phase lock.

4. A method comprising:
   receiving carrier phase estimation information, wherein receiving the carrier phase estimation information comprises receiving one or more points from a communications constellation; and
   estimating a carrier phase based on the carrier phase estimation information by comparing a property of the carrier phase estimation information with a value that is expected assuming phase lock,
   wherein estimating the carrier phase comprises comparing a phase associated with the one or more points with a phase value that is expected assuming phase lock, and
   wherein the phase comprises an average phase.

5. The method of claim 2, wherein estimating the carrier phase comprises comparing an amplitude associated with the one or more points with an amplitude value that is expected assuming phase lock.

6. A method comprising:
   receiving carrier phase estimation information, wherein receiving the carrier phase estimation information comprises receiving a sequence of a plurality of points from a communications constellation; and
   estimating a carrier phase based on the carrier phase estimation information by comparing a property of the carrier phase estimation information with a value that is expected assuming phase lock, wherein estimating the carrier phase comprises comparing an average phase of the sequence with an average phase value that is expected assuming phase lock.

7. The method of claim 1, wherein the carrier phase estimation information comprises a start-up signal defined for an ITU-T Recommendation V.34 or later modem.

8. The method of claim 7, wherein the start-up signal comprises a start-up signal that is selected from the group consisting of S, S-bar, Sh, and Sh-bar as defined in at least one of ITU-T V.32. V.34, and V.90.

9. A method comprising:
   receiving carrier phase estimation information;
   estimating a carrier chase based on the carrier phase estimation information by comparing a property of the carrier phase estimation information with a value that is expected assuming phase lock; and
   iterating through receiving additional carrier phase estimation information and re-estimating the carrier phase based on the additional carrier phase estimation information until a comparison indicates that the property of the received information is within a threshold of the value expected assuming phase lock.

10. The method of claim 9, further comprising using the estimated carrier phase to aid phase lock with a PLL.

11. An article comprising:
    a storage medium having stored thereon data representing sequences of instructions that if executed cause a component of a communication system to estimate a carrier phase based on carrier phase estimation information by comparing a property of the carrier phase estimation information with a value that is expected assuming phase lock,
    wherein the instructions to estimate the carrier phase further comprise instructions that if executed cause the component to:
    determine a carrier phase correction factor based on the comparison of the property of the carrier phase estimation information with the value that is expected assuming phase lock; and
    estimate the carrier phase by applying the carrier phase correction factor to a local phase.

12. The article of claim 11, wherein the instructions to estimate the carrier phase further comprise instructions that if executed cause the component to compare a phase associated with the carrier phase estimation information with a phase value that is expected assuming phase lock.

13. The article of claim 11, wherein the instructions to estimate the carrier phase further comprise instructions that if executed cause the component to compare an amplitude associated with the carrier phase estimation information with an amplitude value that is expected assuming phase lock.

14. The article of claim 11, wherein the carrier phase estimation information comprises one or more points from a communications constellation.

15. The article of claim 11 wherein the carrier phase estimation information comprises a start-up signal defined for an ITU-T Recommendation V.34 or later modem.

16. The article of claim 11, implemented in a computer system wherein the storage medium comprises a DRAM memory.

17. The article of claim 11, implemented in a portable radio communication device, wherein the storage medium comprises a Flash memory.

18. An apparatus comprising:
 a correction factor determination system to determine a carrier phase correction factor by comparing a property of carrier phase estimation information with a value that is expected assuming phase lock;
 a phase generator to generate a phase; and
 a phase combiner coupled with the correction factor determination system to receive the carrier phase correction factor, and coupled with the phase generator to receive the phase, the phase combiner to estimate a carrier phase by combining the carrier phase correction factor with the phase.

19. The apparatus of claim 18, wherein the correction factor determination system comprises a correction factor determination system to compare a phase associated with the carrier phase estimation information with a phase value that is expected assuming phase lock.

20. The apparatus of claim 18, wherein the correction factor determination system comprises a correction factor determination system to compare an amplitude associated with the carrier phase estimation information with an amplitude value that is expected assuming phase lock.

21. The apparatus of claim 18, wherein the carrier phase estimation information comprises a sequence of points from a communications constellation, and wherein the correction factor determination system comprises a correction factor determination system to compare an average phase of the sequence with an average phase value that is expected assuming phase lock.

22. The apparatus of claim 18, wherein the phase combiner is coupled with a PLL to provide the estimated carrier phase to the PLL.

23. The apparatus of claim 18, implemented in a computer system comprising a DRAM memory.

24. The apparatus of claim 18, implemented in a portable radio communication device comprising a Flash memory.

25. An apparatus comprising:
 a Flash memory to store information;
 a communication device to receive information from a communication system; and
 a carrier phase estimation system to estimate a carrier phase, the carrier phase estimation system including:
 a correction factor determination system to determine a carrier phase correction factor by comparing a property of carrier phase estimation information with a value that is expected assuming phase lock;
 a phase generator to generate a phase; and
 a phase combiner coupled with the correction factor determination system to receive the carrier phase correction factor, and coupled with the phase generator to receive the phase, the phase combiner to estimate the carrier phase by combining the carrier phase correction factor with the phase.

26. The apparatus of claim 25, wherein the carrier phase estimation information comprises a sequence of points from a communications constellation, and wherein the correction factor determination system comprises a correction factor determination system to compare a property selected from the group consisting of a phase and an amplitude with a corresponding phase or amplitude value that is expected assuming phase lock.

27. The apparatus of claim 25, wherein the property and the value comprise an average property and an average value.

28. The apparatus of claim 25, further comprising:
 a bus to communicate information; and
 a processor coupled with the bus to process information.

* * * * *